(12) United States Patent
Tomiha

(10) Patent No.: US 9,880,239 B2
(45) Date of Patent: Jan. 30, 2018

(54) RADIO FREQUENCY COIL AND MAGNETIC RESONANCE IMAGING APPARATUS

(71) Applicant: TOSHIBA MEDICAL SYSTEMS CORPORATION, Otawara-shi (JP)

(72) Inventor: Sadanori Tomiha, Nasushiobara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 790 days.

(21) Appl. No.: 14/278,183

(22) Filed: May 15, 2014

(65) Prior Publication Data

US 2014/0247050 A1    Sep. 4, 2014

Related U.S. Application Data

(63) Continuation of application No. PCT/JP2013/073217, filed on Aug. 29, 2013.

(30) Foreign Application Priority Data

Aug. 29, 2012    (JP) .................................. 2012-188837

(51) Int. Cl.
*G01R 33/34* (2006.01)
*G01R 33/36* (2006.01)

(52) U.S. Cl.
CPC .  *G01R 33/34092* (2013.01); *G01R 33/34076* (2013.01); *G01R 33/3657* (2013.01)

(58) Field of Classification Search
CPC ........ G01R 33/34092; G01R 33/34076; G01R 33/3657
See application file for complete search history.

(56) References Cited

U.S. PATENT DOCUMENTS

| | | | | |
|---|---|---|---|---|
| 6,538,441 B1 * | 3/2003 | Watkins | ........... | G01R 33/34046 324/300 |
| 6,661,229 B2 * | 12/2003 | Weyers | ............ | G01R 33/34046 324/318 |
| 7,755,357 B2 | 7/2010 | Holle et al. | | |
| 7,830,146 B2 * | 11/2010 | Tanaka | ............. | G01R 33/34046 324/318 |

FOREIGN PATENT DOCUMENTS

| | | |
|---|---|---|
| JP | 62-147307 | 9/1987 |
| JP | 2008-526273 | 7/2008 |
| JP | 2009-142646 A | 7/2009 |

OTHER PUBLICATIONS

International Search Report (foreign language) for PCT/JP2013/073217 dated Oct. 8, 2013.

* cited by examiner

*Primary Examiner* — Gregory H Curran
(74) *Attorney, Agent, or Firm* — Nixon & Vanderhye P.C.

(57) ABSTRACT

In a radio frequency coil according to an embodiment, electrical conductors and circuit elements are arranged. The radio frequency coil is configured so that the direction in which two of the electrical conductors forming a ring are connected together by one or more of the circuit elements positioned between the electrical conductors is different from the circumferential direction of the radio frequency coil.

10 Claims, 10 Drawing Sheets

US 9,880,239 B2

RADIO FREQUENCY COIL AND MAGNETIC RESONANCE IMAGING APPARATUS

CROSS-REFERENCE TO RELATED APPLICATIONS

This application is a continuation of International Application No. PCT/JP2013/073217, filed on Aug. 29, 2013 which claims the benefit of priority of the prior Japanese Patent Application No. 2012-188837, filed on Aug. 29, 2012, the entire contents of which are incorporated herein by reference.

FIELD

Embodiments described herein relate generally to a radio frequency coil and a magnetic resonance imaging apparatus.

BACKGROUND

Magnetic Resonance Imaging (MRI) apparatuses include one or more radio frequency coils. Examples of the radio frequency coils include a transmission coil having a transmission function to transmit a radio frequency magnetic field, a "reception coil" having a reception function to receive magnetic resonance signals emitted from hydrogen nuclei of an examined subject, and a transmission/reception coil having both of these functions. A radio frequency coil may be configured as, for example, a birdcage whole body coil.

In some situations, a coil having the transmission function (i.e., a transmission coil or a transmission/reception coil) may be used in combination with a reception coil. For example, a coil having the transmission function may be used in combination with a local coil such as a head coil or a phased array coil. In those situations, there is a possibility that an electric interference may occur between the coil having the transmission function and the other reception coil, and thereby heat may be generated by the coil and/or internal circuits may be destructed.

DETAILED DESCRIPTION

In a radio frequency coil according to an embodiment, electrical conductors and circuit elements are arranged. The radio frequency coil is configured so that the direction in which two of the electrical conductors forming a ring are connected together by one or more of the circuit elements positioned between the electrical conductors is different from the circumferential direction of the radio frequency coil.

Exemplary embodiments of a radio frequency coil and an MRI apparatus will be explained below, with reference to the accompanying drawings.

Figure 1:
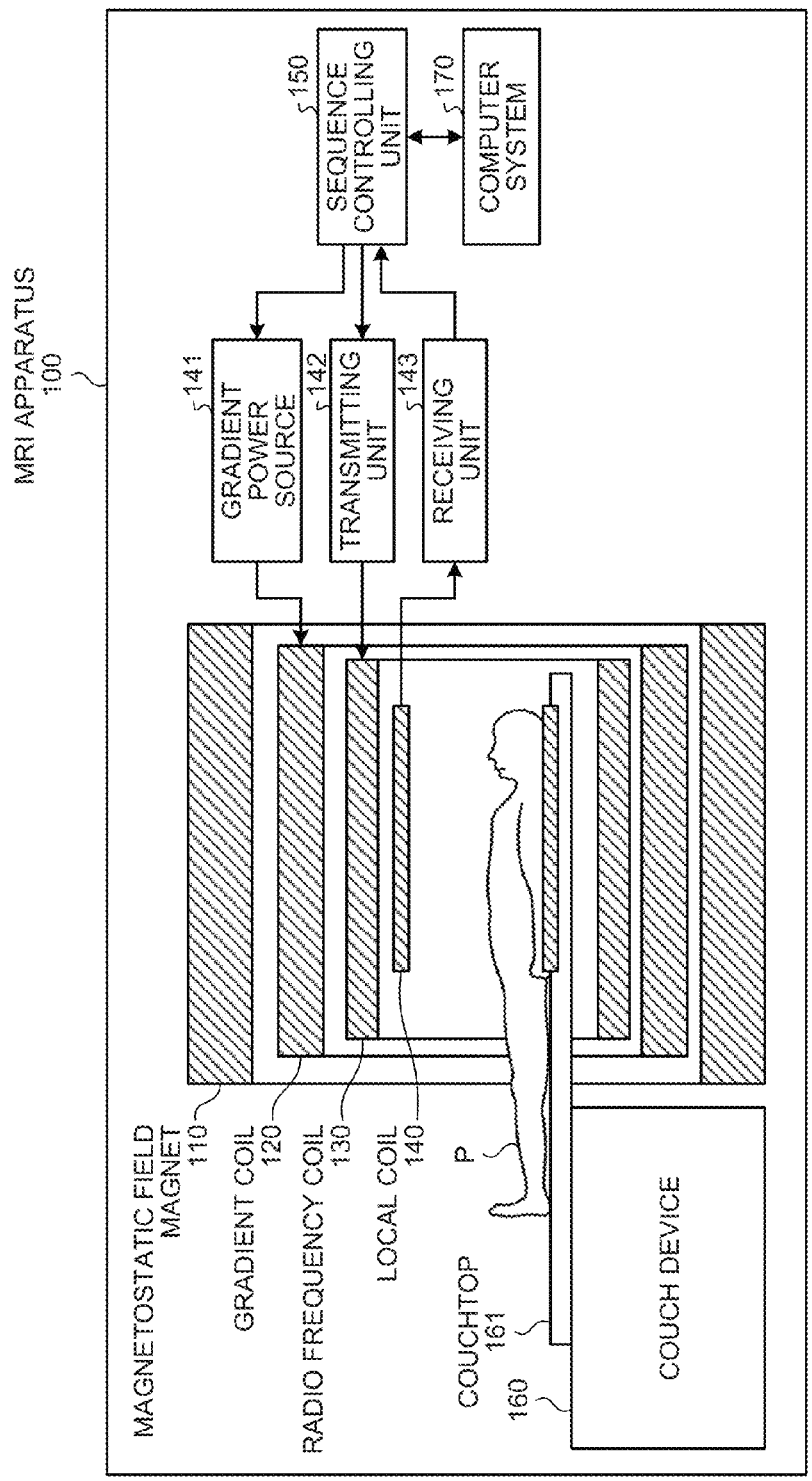
FIG. 1 is a diagram of a configuration of an MRI apparatus according to a first embodiment.

FIG. 1 is a diagram of a configuration of an MRI apparatus 100 according to a first embodiment. An examined subject (hereinafter, a "patient") P is not included in the MRI apparatus 100. A magnetostatic field magnet 110 is formed in the shape of a hollow circular cylinder and generates a uniform magnetostatic field in the space on the inside thereof. The magnetostatic field magnet 110 may be configured by using, for example, a permanent magnet or a superconductive magnet. A gradient coil 120 is formed in the shape of a hollow circular cylinder and generates a gradient magnetic field in the space on the inside thereof. More specifically, the gradient coil 120 is disposed on the inside of the magnetostatic field magnet 110 and generates the gradient magnetic field by receiving a supply of electric power from a gradient power source 141. According to a control signal transmitted from a sequence controlling unit 150, the gradient power source 141 supplies the electric power to the gradient coil 120.

A couch device 160 includes a couchtop 161 on which the patient P is placed. While the patient P is placed thereon, the couchtop 161 is inserted into the hollow, which is an image taking opening, of the gradient coil 120. Normally, the couch device 160 is provided so that the longitudinal direction thereof extends parallel to the central axis of the magnetostatic field magnet 110.

A radio frequency coil 130 is configured to generate a radio frequency magnetic field. More specifically, the radio frequency coil 130 is disposed on the inside of the gradient coil 120 and generates the radio frequency magnetic field by receiving a supply of a radio frequency pulse from a transmitting unit 142. According to a control signal transmitted from the sequence controlling unit 150, the transmitting unit 142 transmits the radio frequency pulse corresponding to a Larmor frequency to the radio frequency coil 130.

A local coil 140 is configured to receive Magnetic Resonance (MR) signals. More specifically, the local coil 140 is disposed on the inside of the gradient coil 120 and receives the MR signals emitted from the patient P due to an influence of the radio frequency magnetic field. Further, the local coil 140 outputs the received MR signals to a receiving unit 143. The local coil 140 according to the first embodiment includes a balun (a protection circuit) in a cable, for the purpose of preventing generation of heat and destruction of internal circuits that may be caused when an electric interference (a coupling) with the radio frequency coil 130 has occurred. It should be noted that, however, in the first embodiment, the electric interference occurring between the radio frequency coil 130 and the local coil 140 is reduced as explained below, and it is thus possible to simplify the configuration of the balun itself.

According to a control signal transmitted from the sequence controlling unit 150, the receiving unit 143 generates MR signal data on the basis of the MR signals being output from the local coil 140. More specifically, the receiving unit 143 generates the MR signal data by applying a digital conversion to the MR signals being output from the local coil 140 and further transmits the generated MR signal data to a computer system 170 via the sequence controlling unit 150. The receiving unit 143 may be provided on a gantry device side where the magnetostatic field magnet 110, the gradient coil 120, and like are provided.

The sequence controlling unit 150 is configured to control the gradient power source 141, the transmitting unit 142, and the receiving unit 143. More specifically, the sequence controlling unit 150 transmits the control signals based on pulse sequence execution data transmitted from the computer system 170, to the gradient power source 141, to the transmitting unit 142, and to the receiving unit 143.

The computer system 170 is configured to control the MRI apparatus 100 in a comprehensive manner, by controlling inputs and outputs of data transmitted to and received from the sequence controlling unit 150. For example, the computer system 170 includes an integrated circuit such as an Application Specific Integrated Circuit (ASIC) or a Field Programmable Gate Array (FPGA), or an electronic circuit such as a Central Processing Unit (CPU) or a Micro Processing Unit (MPU). When having received an editing process performed on image taking conditions by an operator, the computer system 170 generates the pulse sequence execution data on the basis of the received image taking conditions and further transmits the generated pulse sequence execution data to the sequence controlling unit 150. Further, for example, the computer system 170 reconstructs image data from the MR signal data transmitted from the sequence controlling unit 150 and stores the reconstructed image data into a semiconductor memory element (e.g., a Random Access Memory (RAM), a flash memory), a hard disk, an optical disk, or the like.

In the first embodiment, the electric interference occurring between the coils is reduced by appropriately designing a circuit pattern formed by electrical conductors and circuit elements on the surface of the radio frequency coil 130. First, a configuration of a conventional radio frequency coil will be explained. In the following sections, a birdcage whole body coil will be explained as an example of a conventional radio frequency coil.

Figure 2:
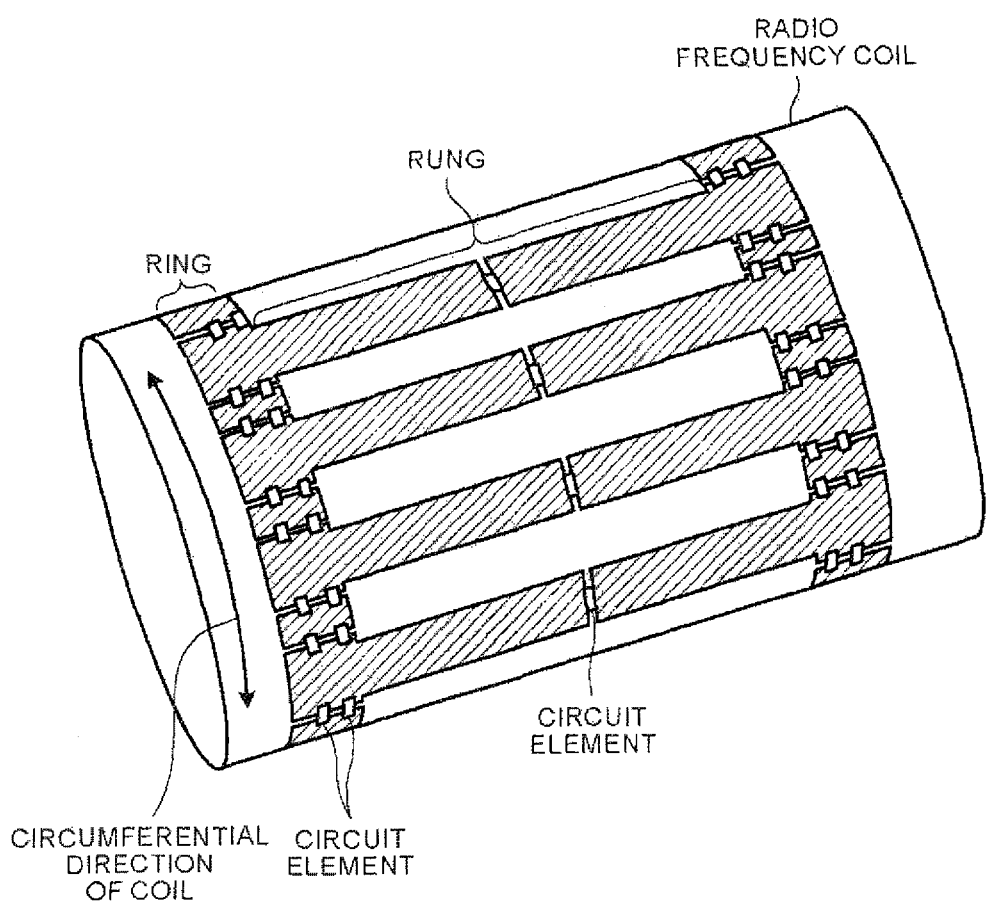
FIG. 2 is a drawing of a configuration of a conventional radio frequency coil.

FIG. 2 is a drawing of a configuration of the conventional radio frequency coil. As illustrated in FIG. 2, the radio frequency coil is formed in the shape of a hollow circular cylinder and has, on the surface thereof, electrical conductors (shown with hatching in FIG. 2) configured with copper foil or the like. Generally speaking, a circuit pattern formed by electrical conductors and circuit elements on the surface of a radio frequency coil includes, as illustrated in FIG. 2, "ring parts" forming rings substantially along the circumferential direction of the coil at the two ends of the circular cylinder and "rung" parts connecting the two rings. Further, as illustrated in FIG. 2, circuit elements (shown with white rectangles in FIG. 2) that are electrically connected to the electrical conductors are disposed between the electrical conductors. For example, the circuit elements are configured with capacitors, p-intrinsic-n (PIN) diodes, or the like and are configured to change the electric currents (hereinafter "currents") flowing through the electrical conductors.

Figure 3:
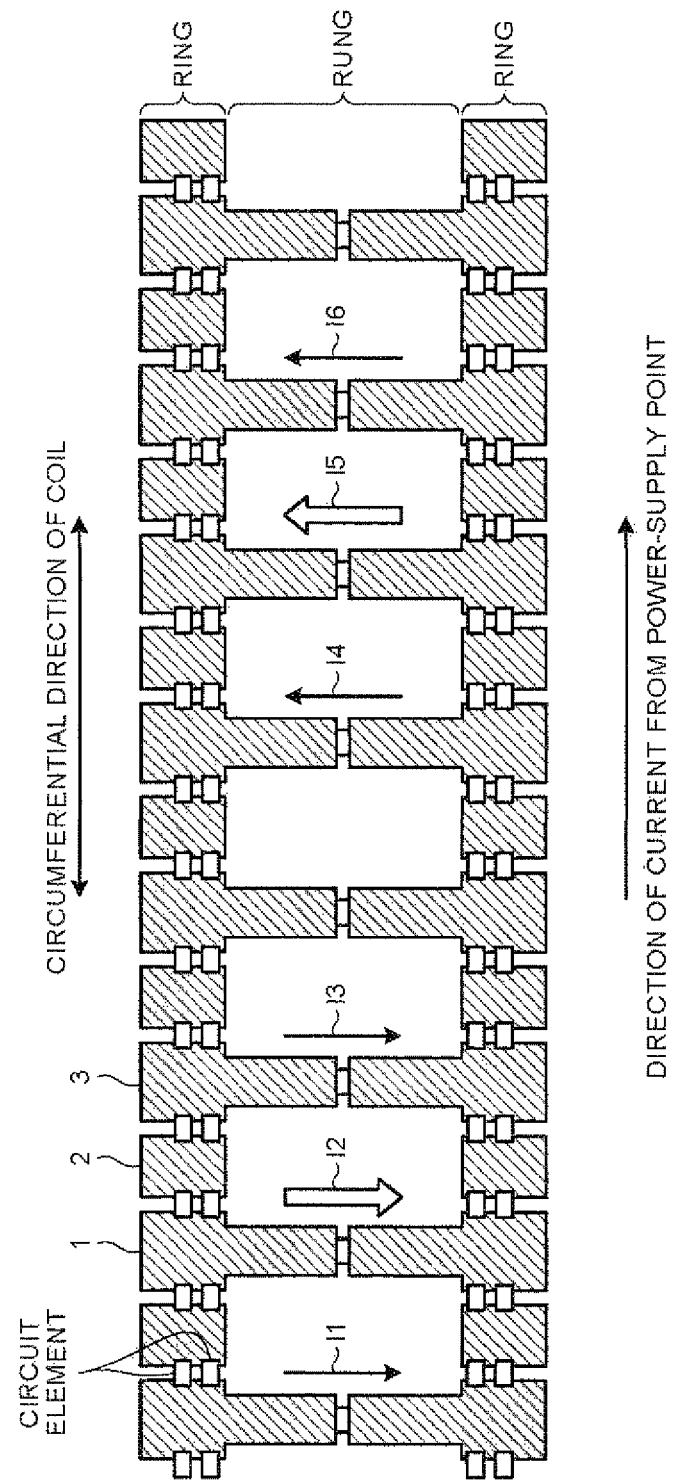
FIG. 3 is a drawing of a circuit pattern of the conventional radio frequency coil developed on a plane.

FIG. 3 is a drawing of a circuit pattern of the conventional radio frequency coil developed on a plane. As illustrated in FIG. 3, when the circuit pattern of the radio frequency coil is developed on a plane, a plurality of electrical conductors having the rungs are cyclically arranged along the circumferential direction of the radio frequency coil. The "circumferential direction of the radio frequency coil" shown in FIG. 3 may be referred to as an "alignment direction of the rungs". In the following sections, each of the electrical conductors having a rung (e.g., the electrical conductor 1, the electrical conductor 3, and so on shown in FIG. 3) will be referred to as an "element".

The circuit pattern goes around the surface of the radio frequency coil once in such a manner that the left end and the right end shown in FIG. 3 are joined together. The radio frequency coil is designed so that the phase is shifted by $2\pi$ at a specific frequency in the one round. By changing the phase of the current flowing between two elements that are positioned adjacent to each other, a radio-frequency magnetic field distribution that is uniform is spatially formed. Further, phase differences are adjusted by the circuit elements disposed between the electrical conductors.

Figure 4:
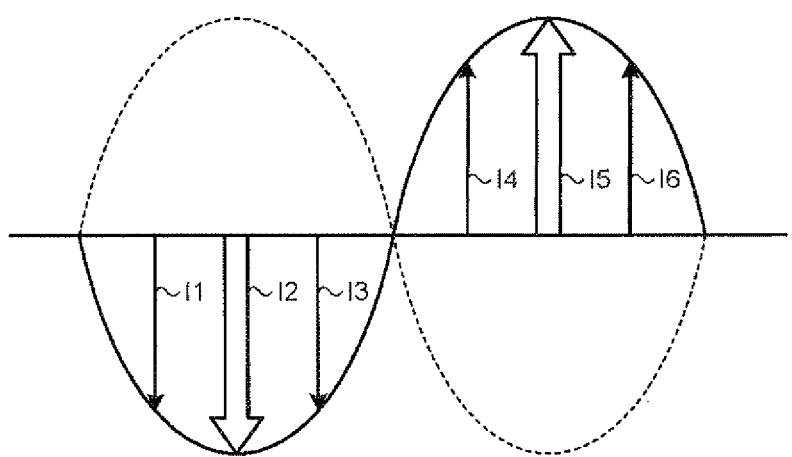
FIG. 4 is a drawing for explaining radio frequency currents flowing through the conventional radio frequency coil.

FIG. 4 is a drawing for explaining radio frequency currents flowing through the conventional radio frequency coil. Because the currents flowing through the radio frequency coil are at a "high frequency (radio frequency)", the waveform drawn in a solid line and the waveform drawn in a broken line alternate in the course of time. Further, in FIG. 4, the directions and the thicknesses of arrows I1 to I6 conceptually indicate directions and magnitudes of the radio frequency currents. Returning to the description of FIG. 3, each of the radio frequency currents I1 to I6 corresponding to the radio frequency currents I1 to I6 shown in FIG. 4 flows through a different one of the elements of the radio frequency coil. Further, there are some elements through which no radio frequency current flows. As explained here, the phases of the radio frequency currents vary among the elements that are arranged along the circumferential direction of the radio frequency coil.

Besides the radio frequency currents flowing through the rungs, a current from a power-supply point flows through the rings. The power-supply point refers to a point at which a radio frequency pulse is supplied from the transmitting unit (not shown in FIG. 3) and is provided at the ring of one of the elements, for example. For example, the current from the power-supply point flows in one direction along the circumferential direction of the coil, as illustrated in FIG. 3.

Figure 5:
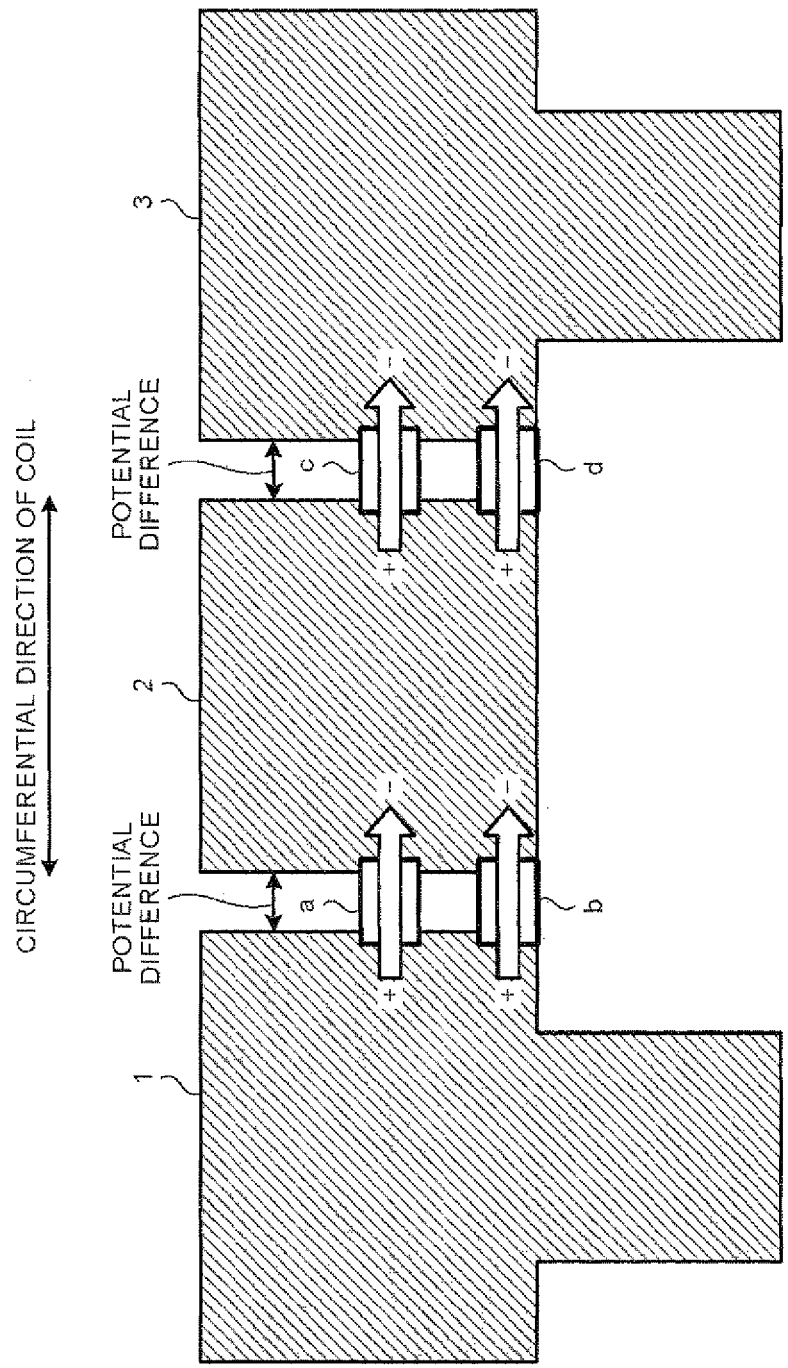
FIG. 5 is an enlarged view of a part of the circuit pattern of the conventional radio frequency coil.

FIG. 5 is an enlarged view of a part of the circuit pattern of the conventional radio frequency coil. Electrical conductors 1, 2, and 3 illustrated in FIG. 5 correspond to the electrical conductors 1, 2, and 3 illustrated in FIG. 3. FIG. 5 is an enlarged view of a part substantially corresponding to a ring. The electrical conductors 1 and 3 are each a longitudinal conductive member having a rung, whereas the conductive member 2 is a rectangular conductive member disposed between the conductive member 1 and the conductive member 3. As described above, the phase differences among the elements are adjusted by the circuit elements disposed between the electrical conductors. When a certain phase difference has been achieved, it means that an electric potential difference (hereinafter, a "potential difference") occurs between the electrical conductors. The outlined arrows in FIG. 5 placed on circuit elements a, b, c, and d indicate the directions of the currents flowing through the circuit elements.

More specifically, as illustrated in FIG. 5, a potential difference occurs between the conductive member 1 and the conductive member 2, and a potential difference occurs between the conductive member 2 and the conductive member 3. Further, a potential difference also occurs between the electrodes at two ends of each of the circuit elements a, b, c, and d connecting the electrical conductors. As a result, electric fields that are locally strong (each having a number of kilowatts, for example) are generated between the conductive member 1 and the conductive member 2, between the conductive member 2 and the conductive member 3, and between the electrodes at the two ends of each of the circuit elements a, b, c, and d.

In this situation, in the example shown in FIG. 5, the electric field generated between the conductive member 1 and the conductive member 2, the electric field generated between the conductive member 2 and the conductive member 3, the electric field generated between the electrodes at the two ends of each of the circuit elements a, b, c, and d, and the currents flowing through the electrical conductors 1, 2, and 3 are all oriented in substantially the same direction along the circumferential direction of the coil. In that situation, if a circuit pattern, a circuit element, a cable, or the like of another coil such as the local coil comes in contact along this direction, there is a possibility that an electric interference (a coupling) may be caused between the radio frequency coil and the other coil, and thereby heat may be generated by the other coil and/or internal circuits may be destructed.

Figure 6:
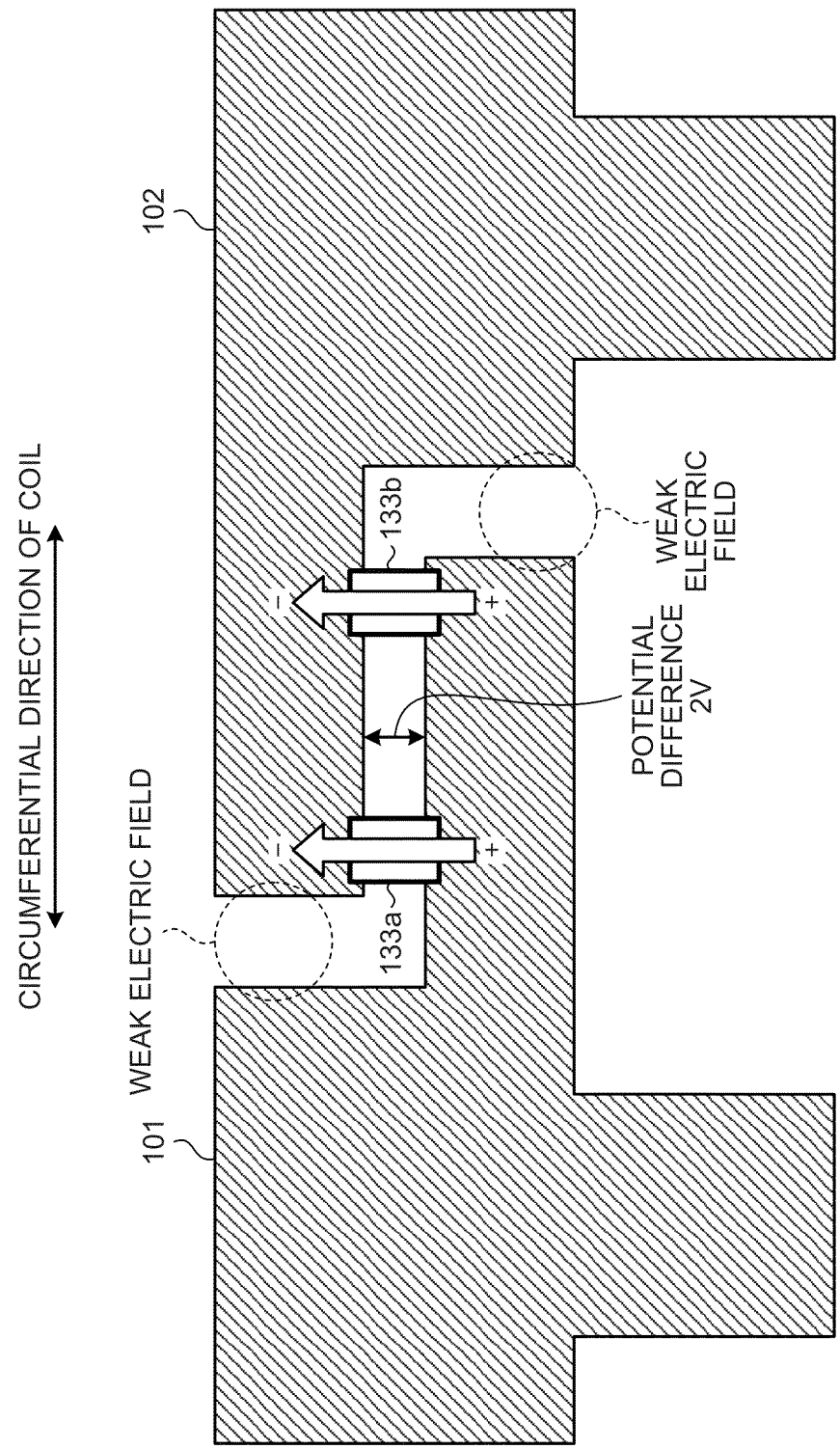
FIG. 6 is an enlarged view of a part of a circuit pattern of a radio frequency coil according to the first embodiment.

FIG. 6 is an enlarged view of a part of a circuit pattern of the radio frequency coil 130 according to the first embodiment. When the circuit pattern of the radio frequency coil 130 according to the first embodiment is developed on a plane, the circuit pattern illustrated in FIG. 6 repeatedly appears at each of the two ends of the circular cylinder of the radio frequency coil 130.

As illustrated in FIG. 6, the radio frequency coil 130 according to the first embodiment is configured so that the circuit elements are arranged in such a manner that the direction in which two electrical conductors are connected together by the circuit elements is different from the circumferential direction of the radio frequency coil 130. In other words, the circuit elements are arranged in such a manner that the direction of a straight line that defines the shortest distance between the electrical conductors on the ring is different from the circumferential direction (the direction of a straight line extending along the circumferential direction) of the radio frequency coil 130. Further, in other words, it means that the direction in which two electrical conductors are connected together forms an angle with the circumferential direction of the radio frequency coil 130, in such a manner that a straight line extending in the direction in which two electrical conductors are connected together by circuit elements is in an intersecting relationship (e.g., in a non-parallel relationship) with a straight line extending in the circumferential direction of the radio frequency coil 130. Further, in other words, in at least a part of the circumference of each of the rings, the electrical conductors forming the ring are arranged in a multiple-row formation along the axial direction of the radio frequency coil 130 (i.e., a direction that is substantially orthogonal to the circumferential direction of the radio frequency coil 130). In FIG. 6, the "direction in which the two electrical conductors are connected together" is a direction parallel to the outlined arrows. Further, in FIG. 6, the circumferential direction of the radio frequency coil 130 is substantially the same as the primary direction of the current flowing in the ring of the circuit pattern.

For example, in the first embodiment, no rectangular electrical conductors corresponding to the conductive member 2 illustrated in FIG. 5 are provided. Instead, in the first embodiment, electrical conductors (a conductive member 101 and a conductive member 102) serving as elements and being positioned adjacent to each other form a double-row ring. As a result, in at least a part of the circumference of each of the rings, electrical conductors are arranged in a double-row formation along a direction that is substantially orthogonal to the circumferential direction of the radio frequency coil 130. Further, as illustrated in FIG. 6, a circuit element 133a and a circuit element 133b are each arranged so as to extend across the double-row ring formed by the conductive member 101 and the conductive member 102. In FIG. 6, the outlined arrows placed on the circuit element 133a and the circuit element 133b indicate the directions in which the currents flow through the circuit elements.

In this situation, the directions of the electric field generated between the electrodes at the two ends of the circuit element 133a and the electric field generated between the electrodes at the two ends of the circuit element 133b are substantially orthogonal to the circumferential direction of the coil. A weak electric field is generated between the conductive member 101 and the conductive member 102 as indicated with a dotted circle in FIG. 6; however, the strength of the electric field is lower than the strength of the electric field generated between the electrodes at the two ends of each of the circuit elements 133a and 133b. In other words, the dominant electric field generated between the electrical conductors is more dominant in the direction that is substantially orthogonal to the circumferential direction of the coil, in contrast to the positional arrangements of the circuit elements shown in FIG. 5.

According to the first embodiment configured in this manner, even if a circuit pattern, a circuit element, a cable, or the like of another coil such as the local coil comes in contact along the circumferential direction of the coil, because the directions of the electric fields are dispersed and because no strong electric field is generated in substantially the same direction as the circumferential direction of the coil (because the locally-strong electric fields generated near the circuit elements are reduced), the electric interference occurring between the radio frequency coil 130 and the other coil is reduced, and it is therefore possible to lower the possibility that heat may be generated by the other coil and that the internal circuits may be destructed. As a result, it is possible to simplify the configuration of the balun itself that is provided in the local coil 140. The cable of the local coil 140 can also be simplified. Accordingly, it becomes easier to handle the local coil 140 itself, and the operability for the operator is also improved. Further, because it is possible to reduce the heat generation, calculation of a Specific Absorption Rate (SAR) also becomes easier. These advantageous effects are also achieved in the other embodiments.

In the first embodiment, the circuit elements are positioned substantially perpendicular to the circumferential direction of the coil, in such a manner that the direction of the electric field generated between the electrodes at the two ends of each of the circuit elements is substantially orthogonal to the circumferential direction of the coil; however, possible embodiments are not limited to this example. It is also possible to arrange the circuit elements to be positioned diagonally with respect to the circumferential direction of the coil. In that situation, the shape of the circuit pattern may also be changed appropriately so as to fit the diagonal arrangement of the circuit elements.

Figure 7:
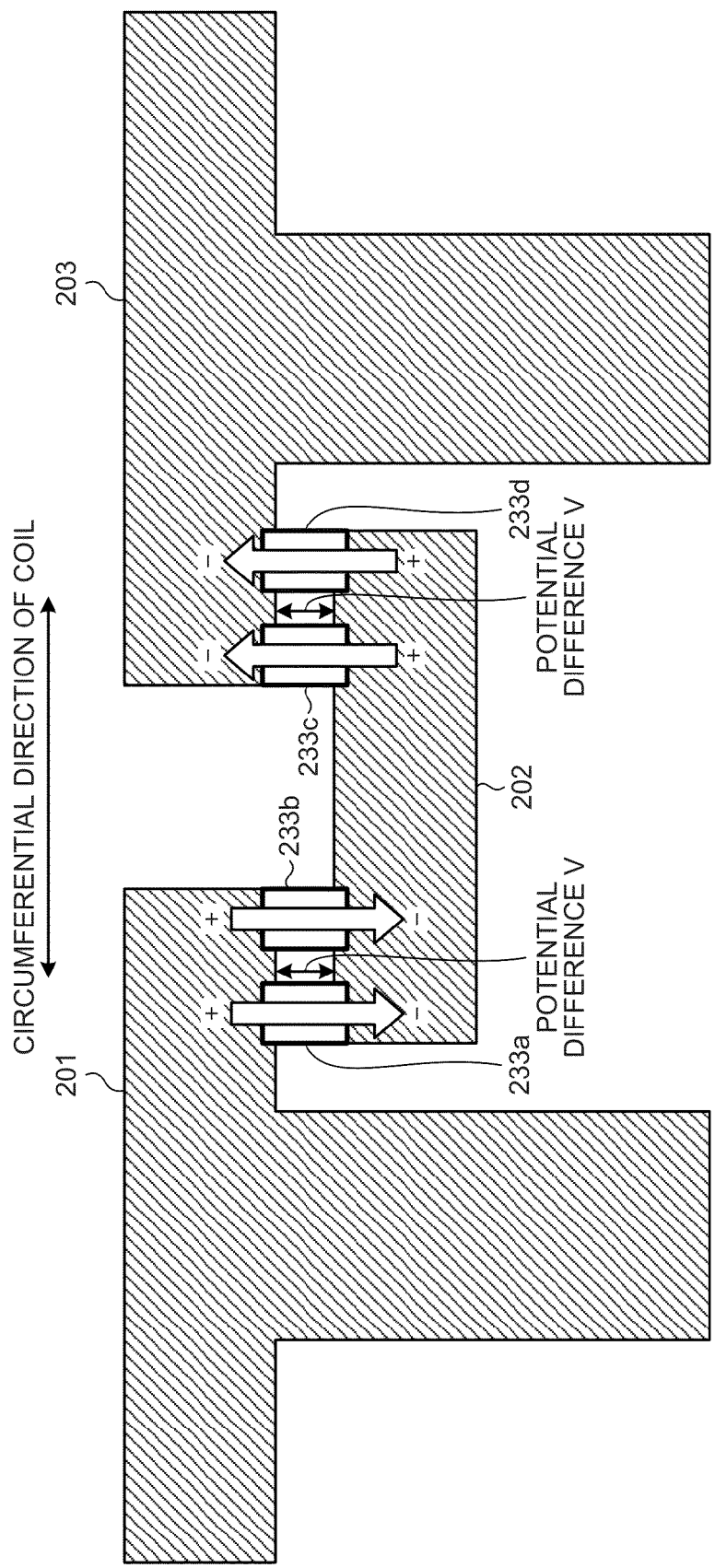
FIG. 7 is an enlarged view of a part of a circuit pattern of a radio frequency coil according to a second embodiment.

FIG. 7 is an enlarged view of a part of a circuit pattern of a radio frequency coil 230 according to a second embodiment. When the circuit pattern of the radio frequency coil 230 according to the second embodiment is developed on a plane, the circuit pattern illustrated in FIG. 7 repeatedly appears at each of the two ends of the circular cylinder of the radio frequency coil 230. Although the radio frequency coil 230 according to the second embodiment will be explained in the following sections, the constituent elements other than the radio frequency coil 230 are the same as those provided in the MRI apparatus 100 according to the first embodiment.

As illustrated in FIG. 7, the radio frequency coil 230 according to the second embodiment is also configured so that the circuit elements are arranged in such a manner that the direction in which two electrical conductors are connected together by the circuit elements is different from the circumferential direction of the radio frequency coil 230.

For example, in the second embodiment, a conductive member 202 is disposed in the same manner as the rectangular conductive member corresponding to the conductive member 2 illustrated in FIG. 5. A conductive member 201 serving as an element and the conductive member 202 that is not an element form a double-row ring, whereas a conductive member 203 serving as an element and the conductive member 202 that is not an element form a double-row ring. As a result, like in the first embodiment, in at least a part of the circumference of each of the rings, the electrical conductors are arranged in a double-row formation along the direction that is substantially orthogonal to the circumferential direction of the radio frequency coil 230. Further, as illustrated in FIG. 7, a circuit element 233a and a circuit element 233b are each arranged so as to extend across the double-row ring formed by the conductive member 201 and the conductive member 202. Similarly, a circuit element 233c and a circuit element 233d are each arranged so as to extend across the double-row ring formed by the conductive member 203 and the conductive member 202. In FIG. 7, the outlined arrows placed on the circuit element 233a, the circuit element 233b, the circuit element 233c, and the circuit element 233d indicate the directions in which the currents flow through the circuit elements.

In this situation, the directions of the electric field generated between the electrodes at the two ends of the circuit element 233a, the electric field generated between the electrodes at the two ends of the circuit element 233b, the electric field generated between the electrodes at the two ends of the circuit element 233c, and the electric field generated between the electrodes at the two ends of the circuit element 233d are substantially orthogonal to the circumferential direction of the coil. Further, because the distance between the conductive member 201 and the conductive member 203 in the second embodiment is longer than that in the first embodiment, the electric fields in the same direction as the circumferential direction of the coil are weaker than those in the first embodiment.

Accordingly, even if a circuit pattern, a circuit element, a cable, or the like of another coil such as the local coil comes in contact along the circumferential direction of the coil, because no strong electric field is generated in substantially the same direction as the circumferential direction of the coil in the second embodiment also, similarly to the example in the first embodiment, the electric interference occurring between the radio frequency coil 230 and the other coil is reduced, and it is therefore possible to lower the possibility that heat may be generated by the other coil and that the internal circuits may be destructed.

Further, as illustrated in FIG. 7, the direction of the electric field generated between the conductive member 201 and the conductive member 202 is opposite to the direction of the electric field generated between the conductive member 203 and the conductive member 202. Thus, these electric fields are in a relationship to cancel each other. Accordingly, even if a circuit pattern, a circuit element, a cable, or the like of another coil such as the local coil comes in contact, along a direction orthogonal to the circumferential direction of the coil, it is possible to reduce the electric interference occurring between the radio frequency coil and the other coil, in the second embodiment.

Further, even if a circuit pattern, a circuit element, a cable, or the like of another coil such as the local coil comes in contact, in the vicinity of the circuit element 233a, 233b, 233c, or 233d along a direction orthogonal to the circumferential direction of the coil, the influence thereof is smaller, because the potential difference is half of the potential difference in the first embodiment.

In the second embodiment, the circuit elements are positioned substantially perpendicular to the circumferential direction of the coil, in such a manner that the direction of the electric field generated between the electrodes at the two ends of each of the circuit elements is substantially orthogonal to the circumferential direction of the coil; however, possible embodiments are not limited to this example. It is also possible to arrange the circuit elements to be positioned diagonally with respect to the circumferential direction of the coil. In that situation, the shape of the circuit pattern may also be changed appropriately so as to fit the diagonal arrangement of the circuit elements.

Figure 8:
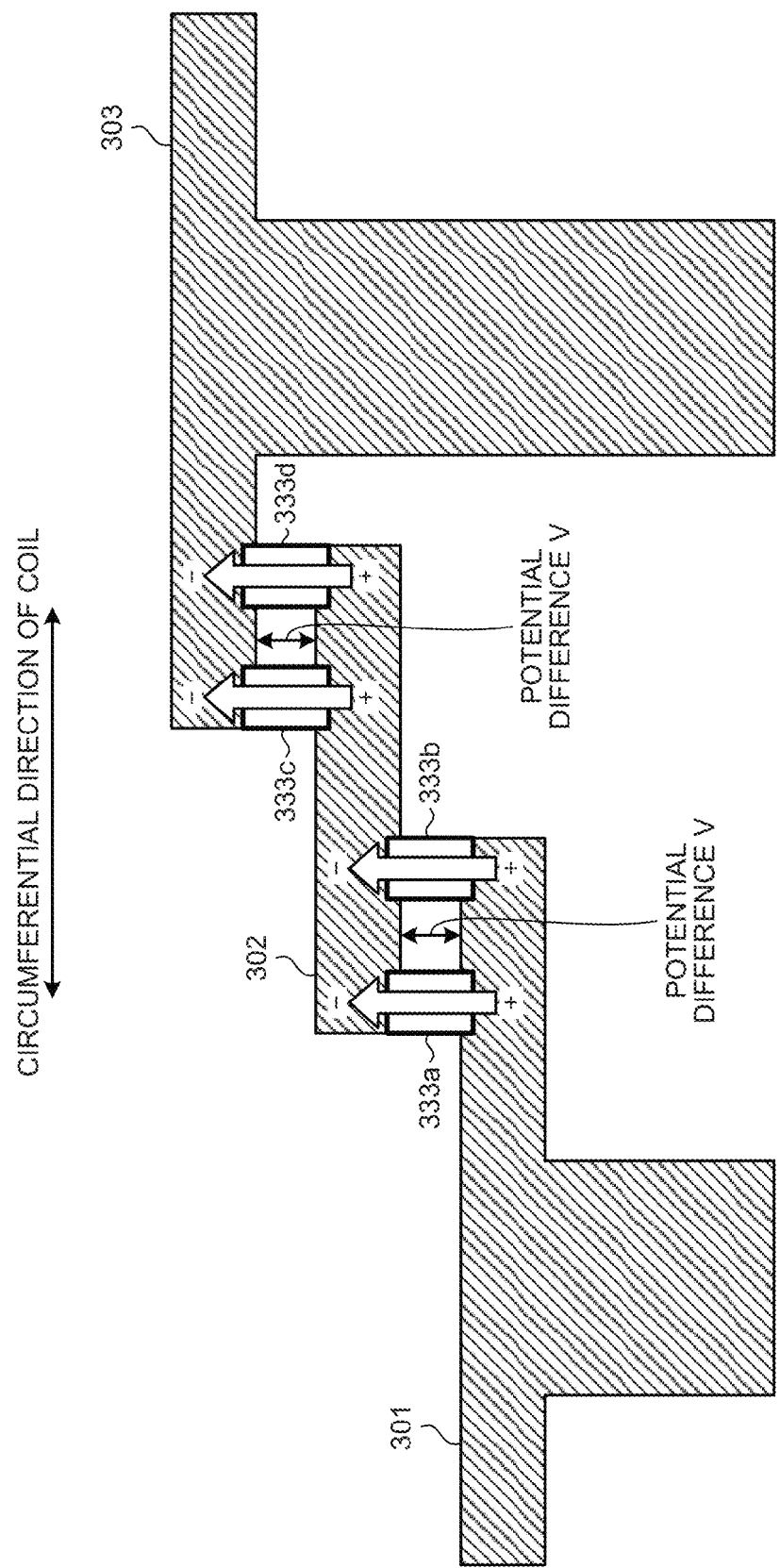
FIG. 8 is an enlarged view of a part of a circuit pattern of a radio frequency coil according to a third embodiment.

FIG. 8 is an enlarged view of a part of a circuit pattern of a radio frequency coil 330 according to a third embodiment. Although the radio frequency coil 330 according to the third embodiment will be explained in the following sections, the constituent elements other than the radio frequency coil 330 are the same as those provided in the MRI apparatus 100 according to the first embodiment.

As illustrated in FIG. 8, the radio frequency coil 330 according to the third embodiment is also configured so that the circuit elements are arranged in such a manner that the direction in which two electrical conductors are connected together by the circuit elements is different from the circumferential direction of the radio frequency coil 330. Further, in other words, the positions of the electrical conductors forming each of the rings are out of alignment with respect to the alignment direction of the electrical conductors forming the rungs. For example, an imaginary line connecting the electrical conductors forming each of the rings is out of alignment at an angle, with respect to the alignment direction of the electrical conductors forming the rungs. The example illustrated in FIG. 9 (a circuit pattern developed on a plane) described later may be expressed that the electrical conductors forming each of the rings are arranged in a zigzag formation (such as a line bending many times or a curved line).

For example, in the third embodiment, a conductive member 302 is disposed in the same manner as the rectangular conductive member corresponding to the conductive member 2 illustrated in FIG. 5. A conductive member 301 serving as an element and the conductive member 302 form a double-row ring, whereas the conductive member 302 and a conductive member 303 serving as an element form a double-row ring. As a result, like in the first embodiment, in at least a part of the circumference of each of the rings, the electrical conductors are arranged in a formation of at least two rows, along the direction that is substantially orthogonal to the circumferential direction of the radio frequency coil 330. Further, as illustrated in FIG. 8, a circuit element 333a and a circuit element 333b are each arranged so as to extend across the double-row ring formed by the conductive member 301 and the conductive member 302. Similarly, a circuit element 333c and a circuit element 333d are each arranged so as to extend across the double-row ring formed by the conductive member 302 and the conductive member 303. In FIG. 8, the outlined arrows placed on the circuit element

333*a*, the circuit element 333*b*, the circuit element 333*c*, and the circuit element 333*d* indicate the directions in which the currents flow through the circuit elements.

In this situation, the directions of the electric field generated between the electrodes at the two ends of the circuit element 333*a*, the electric field generated between the electrodes at the two ends of the circuit element 333*b*, the electric field generated between the electrodes at the two ends of the circuit element 333*c*, and the electric field generated between the electrodes at the two ends of the circuit element 333*d* are substantially orthogonal to the circumferential direction of the coil. Further, because the distance between the conductive member 301 and the conductive member 303 in the third embodiment is longer than that in the first embodiment, the electric fields in the same direction as the circumferential direction of the coil are weaker than those in the first embodiment.

Accordingly, even if a circuit pattern, a circuit element, a cable, or the like of another coil such as the local coil comes in contact along the circumferential direction of the coil, because no strong electric field is generated in substantially the same direction as the circumferential direction of the coil in the third embodiment also, similarly to the example in the first embodiment, the electric interference occurring between the radio frequency coil 330 and the other coil is reduced, and it is therefore possible to lower the possibility that heat may be generated by the other coil and that the internal circuits may be destructed.

Further, even if a circuit pattern, a circuit element, a cable, or the like of another coil such as the local coil comes in contact, in the vicinity of the circuit element 333*a*, 333*b*, 333*c*, or 333*d* along a direction orthogonal to the circumferential direction of the coil, the influence thereof is small.

Figure 9:
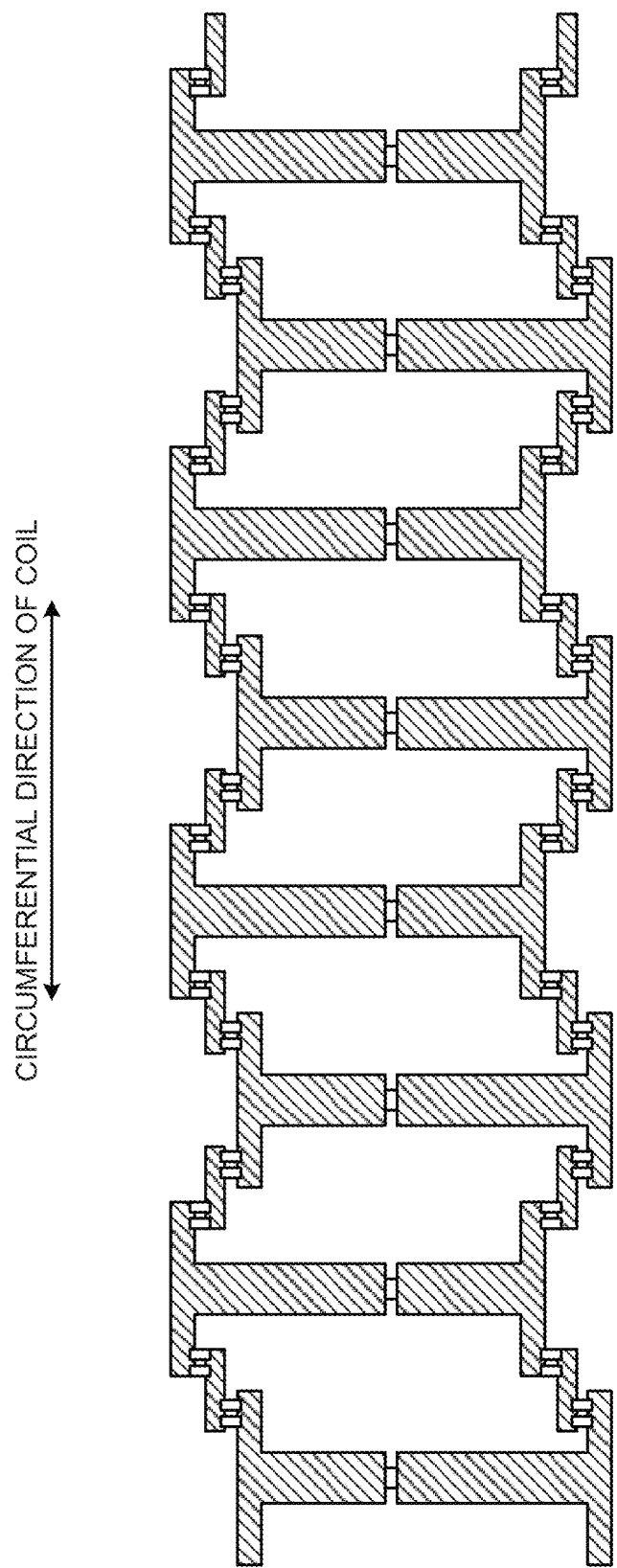
FIG. 9 is a drawing of the circuit pattern of the radio frequency coil according to the third embodiment developed on a plane.

FIG. 9 is a drawing of a circuit pattern of the radio frequency coil 330 according to the third embodiment developed on a plane. As illustrated in FIG. 9, in the third embodiment, the circuit pattern formed on the surface of the radio frequency coil 330 has a cyclic structure (e.g., four electrical conductors are in one cycle). In other words, in the third embodiment, the electrical conductors are arranged on each of the rings along a cyclic curve that circles around the ring. The cyclic structure makes it physically difficult for a strong electric field to be generated between the electrodes at the two ends of each of the circuit elements and makes it physically difficult for an electric interference to occur with a circuit pattern, a circuit element, a cable, or the like of another coil, on the surface of the radio frequency coil 330.

The cyclic structure may be designed in accordance with a mechanical restriction (e.g., a restriction given to the angle by a physical relationship between the size of the radio frequency coil 330 and the quantity and the lengths of the elements) that changes along the circumferential direction of the radio frequency coil 330 or may be designed on the basis of electric phases.

Figure 10:
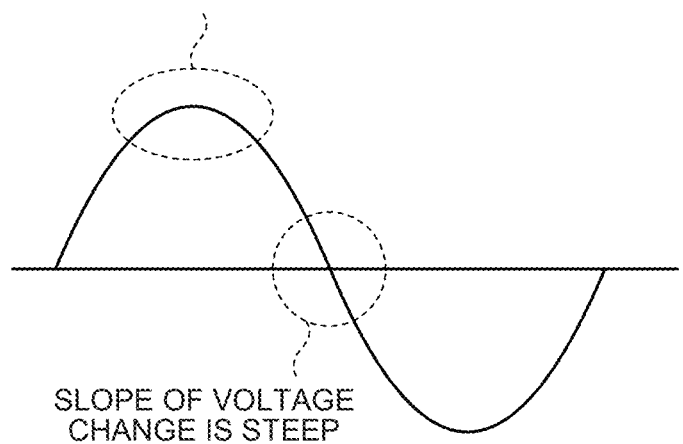
FIG. 10 is a chart of changes in a voltage of the radio frequency coil according to the third embodiment.

FIG. 10 is a chart of changes in the voltage of the radio frequency coil 330 according to the third embodiment. The changes in the phase of the radio frequency current flowing through the elements have been explained above with reference to FIG. 4. Similarly, as illustrated in FIG. 10, the voltage at each of the elements also changes in accordance with the changes in the phase of the radio frequency current. In FIG. 10, the changes in the voltage are expressed with a continuous curve for the sake of convenience in the explanation; however, the voltage in actuality exhibits discrete values.

As illustrated in FIG. 10, the changes in the voltage exhibit a gradual slope in a certain part and exhibit a steep slope in a certain part. For this reason, for example, it is possible to design the positional arrangements of the elements in such a manner that the portion with the diagonal circuit pattern formed by the electrical conductors 301, 302, and 303 illustrated in FIG. 8 overlaps with the part where the voltage change exhibits a steep slope. Considering that there is a low possibility that a cable or the like of another coil may extend along a zigzag curve diagonally, the structure also makes it physically difficult for an electric interference with the other coil to occur.

In the third embodiment, the circuit elements are positioned substantially perpendicular to the circumferential direction of the coil, in such a manner that the direction of the electric field generated between the electrodes at the two ends of each of the circuit elements is substantially orthogonal to the circumferential direction of the coil; however, possible embodiments are not limited to this example. It is also possible to arrange the circuit elements to be positioned diagonally with respect to the circumferential direction of the coil. In that situation, the shape of the circuit pattern may also be changed appropriately so as to fit the diagonal arrangement of the circuit elements. Further, in the third embodiment, the example is explained in which the electrical conductors serving as the elements (i.e., the electrical conductors 301 and 303) have the other conductive member 302 interposed therebetween; however, possible embodiments are not limited to this example. The circuit elements may be arranged so as to extend directly across the electrical conductors serving as the elements (e.g., across the electrical conductors 301 and 303), without having the conductive member 302 interposed therebetween. In that situation, the interposed conductive member 302 does not necessarily have to be provided.

The circuit patterns of the radio frequency coils are not limited to those described in the first to the third embodiments above. In the first to the third embodiments, the circuit pattern may be designed as appropriate in such a manner that the direction of the electric field generated at each of the circuit elements is different from the primary direction of the current flowing through the electrical conductors positioned near the circuit element (not the direction of the current flowing through the circuit element itself). As mentioned above, it is acceptable if the two directions are at an angle, and the two directions do not necessarily have to be in an orthogonal relationship.

In the first to the third embodiments described above, the radio frequency coil is assumed to be a birdcage whole body coil, for example; however, possible embodiments are not limited to this example. For example, the disclosure herein is applicable to radio frequency coils having other shapes such as a radio frequency coil of a saddle type or of a slot resonator type.

By using the radio frequency coil or the magnetic resonance imaging apparatus according to at least one aspect of the exemplary embodiments described above, it is possible to reduce the electric interference occurring between the coils.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A radio frequency (RF) coil in which electrical conductors and circuit elements are arranged with circuit elements positioned between electrical conductors forming a ring on a common cylindrical surface, said conductors being configured to form a ring along a circumferential direction while also defining plural gaps there-between on said common cylindrical surface that extend in a direction that is not perpendicular with respect to said circumferential direction; and at least one of said circuit elements being connected on said common cylindrical surface across each of said gaps along a direction that is transverse to said circumferential direction wherein a direction in which two of the electrical conductors are connected together by one or more of the circuit elements is different from said circumferential direction thereby reducing the likelihood of electrical interference with other RF coils.

2. The radio frequency coil according to claim 1, wherein the circuit elements are connected across the gaps in a direction of a straight line that defines a shortest distance between the electrical conductors.

3. The radio frequency coil according to claim 1, wherein, in at least a part of a circumference of each ring, the electrical conductors are arranged in juxta-positioned multiple-rows spaced apart from each other in a direction that is substantially orthogonal to the circumferential direction so as to define said gaps along a direction that is substantially parallel to said circumferential direction, while one or more of the circuit elements are connected between the electrical conductors in juxta-positioned rows.

4. The radio frequency coil according to claim 1, wherein the circuit elements are arranged in such a manner that the direction in which two of the electrical conductors are connected together by one or more of the circuit elements is substantially orthogonal to the circumferential direction of the radio frequency coil on said common cylindrical surface.

5. The radio frequency coil according to claim 2, wherein the electrical conductors are arranged in such a manner that the direction of the straight line that defines the shortest distance between the electrical conductors on the ring is substantially orthogonal to the circumferential direction of the radio frequency coil.

6. A radio frequency coil in which electrical conductors and circuit elements are arranged with circuit elements positioned between electrical conductors forming a ring on a cylindrical surface, wherein:

a direction in which two of the electrical conductors forming a ring are connected together by one or more of the circuit elements positioned between the electrical conductors is different from a circumferential direction of the radio frequency coil; and the electrical conductors are arranged on each ring along a cyclic curve that circles around the ring.

7. The radio frequency coil according to claim 6, wherein the electrical conductors are arranged in accordance with a mechanical restriction that changes along the circumferential direction of the radio frequency coil.

8. The radio frequency coil according to claim 6, wherein the electrical conductors are arranged on a basis of electric phase changes that change along the circumferential direction of the radio frequency coil.

9. A radio frequency (RF) coil in which electrical conductors and circuit elements are arranged with circuit elements positioned between electrical conductors forming a ring on a common cylindrical surface, said conductors being configured to form a ring along a circumferential direction while also defining plural gaps there-between on said common cylindrical surface that extend in a direction that is not perpendicular with respect to said circumferential direction; and at least one of said circuit elements being connected on said common cylindrical surface across each of said gaps along a direction that is transverse to said circumferential direction wherein a direction of an electric field generated between electrodes of each of the circuit elements is different from directions of electric currents flowing through the electrical conductors thereby reducing the likelihood of electrical interference with other RF coils.

10. A magnetic resonance imaging apparatus comprising a radio frequency (RF) coil in which electrical conductors and circuit elements are arranged with circuit elements positioned between electrical conductors forming a ring on a common cylindrical surface, said conductors being configured to form a ring along a circumferential direction while also defining plural gaps there-between on said common cylindrical surface that extend in a direction that is not perpendicular with respect to said circumferential direction; and at least one of said circuit elements being connected on said common cylindrical surface across each of said gaps along a direction that is transverse to said circumferential direction wherein the radio frequency coil is configured so that a direction in which two of the electrical conductors are connected together by one or more of the circuit elements is different from the circumferential direction thereby reducing the likelihood of electrical interference with other RF coils.

* * * * *